(12) United States Patent
Hatcher et al.

(10) Patent No.: US 6,785,530 B2
(45) Date of Patent: Aug. 31, 2004

(54) EVEN-ORDER NON-LINEARITY CORRECTION FEEDBACK FOR GILBERT STYLE MIXERS

(75) Inventors: Geoffrey Hatcher, Irvine, CA (US); Alyosha C. Molnar, Costa Mesa, CA (US); Rahul Magoon, Irvine, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 622 days.

(21) Appl. No.: 09/811,133

(22) Filed: Mar. 16, 2001

(65) Prior Publication Data

US 2002/0193089 A1 Dec. 19, 2002

(51) Int. Cl.⁷ .................................................. H04B 1/26
(52) U.S. Cl. ...................... 455/326; 455/323; 455/330; 455/333; 327/113; 327/359
(58) Field of Search ................................ 455/323, 326, 455/330, 333; 327/113, 355, 357, 358, 359

(56) References Cited

U.S. PATENT DOCUMENTS

| | | | | |
|---|---|---|---|---|
| 5,448,772 A | * | 9/1995 | Grandfield | ............... 455/333 |
| 5,548,840 A | * | 8/1996 | Heck | ..................... 455/326 |
| 6,040,731 A | * | 3/2000 | Chen et al. | .............. 327/359 |
| 6,057,714 A | * | 5/2000 | Andrys et al. | ........... 327/105 |
| 6,140,849 A | * | 10/2000 | Trask | ..................... 327/113 |
| 6,205,325 B1 | * | 3/2001 | Groe | ....................... 455/333 |
| 6,249,170 B1 | * | 6/2001 | Main et al. | ............... 327/350 |
| 6,255,889 B1 | * | 7/2001 | Branson | .................. 327/359 |
| 6,393,267 B1 | * | 5/2002 | Trask | ..................... 455/326 |
| 6,396,330 B1 | * | 5/2002 | Fujii | ...................... 327/355 |
| 6,400,936 B1 | * | 6/2002 | Trask | ..................... 455/326 |
| 6,438,365 B1 | * | 8/2002 | Balteanu | ................. 455/326 |

* cited by examiner

Primary Examiner—Edward F. Urban
Assistant Examiner—Duy K Le
(74) Attorney, Agent, or Firm—The Eclipse Group

(57) ABSTRACT

Double balanced mixers having transistor pairs are affected by area mismatches between the transistors. The area mismatches can be represented as a ratio between the mixer core transistors that is directly related to voltage. Thus, an input voltage into one of the mixer core transistors in a transistor pair can compensate for the area mismatch. The compensation is achieved by a voltage track and hold feedback loop to one of the mixer core transistors.

23 Claims, 3 Drawing Sheets

EVEN-ORDER NON-LINEARITY CORRECTION FEEDBACK FOR GILBERT STYLE MIXERS

BACKGROUND OF THE INVENTION

1. Technical Field

This invention relates generally to radio frequency (RF) mixers and, in particular, to double balanced mixers.

2. Related Art

Even-order non-linearities in analog circuits result in undesirable even-order distortion that results in signal dependent direct current (DC) offsets. Since double balanced mixers featuring transistors (such as a Gilbert cell mixer) are differential, even-order harmonics appear as undesired effects of circuit mismatches. The circuit mismatches are seen in the shifting of the on-and-off cycle of the core transistors that results in even-order distortion and noticeable signal dependent DC offsets that can mask a desired DC signal. Certain kinds of transistor mismatches, such as area mismatch, result in signal dependent DC offsets. Double balanced mixers that perform direct conversion from a RF signal to a baseband signal are susceptible to the DC offset generated by the even-order distortions corrupting the desired output signal. Further, the DC offset is not dependent on frequency and creates additional problems in cellular telephony applications, such as GSM cellular applications, where blocking signals are present and may effectively mask the desired signal.

The degradation or loss of DC information during conversion to a DC signal is not a problem when intermediate steps of converting the RF signal to the baseband signal are used (usually due to AC coupling of the signal between stages). However, in a one-step conversion from the RF signal to the baseband signal, the DC offsets caused by the even-order distortions are a problem that is not easily resolved. When attempting to avoid a DC offset problem that adversely affects the signal, there are generally two approaches used to reduce the magnitude of the DC offset generated by the even order distortions as a result of the area mismatch. The first approach in suppressing the signal dependent DC offsets increases the core transistors' size in order to reduce the area mismatch. The second approach utilizes large amounts of current in the local oscillator (LO) driver to increase the switching speed of the transistors. By increasing the switching speed, the transistors spend less time in the susceptible region (both transistors in the pair are on) where the area mismatch of the transistors adversely affects the output signal.

An increase in transistor size requires an increase in drive current without any positive effect on the switching speed. As drive current is increased, an undesirable reduction in battery time results. A reduction in battery time or life is undesirable in portable/mobile communication products. The second approach of increasing switching speed increases the current in the LO driver that is necessary to control the mixer core transistors and results in lower drive impedance. The higher bias current also adversely affects the battery life of portable/mobile communication products. Thus, either approach of suppressing even-order distortions requires large amounts of current that impact battery time. Therefore, what is needed in the art is a differential type mixer that can directly convert a RF signal to a baseband signal while avoiding a loss or degradation of the DC signal by reducing the even-order distortions without having to increase the transistor area or the bias current.

SUMMARY

Broadly conceptualized, the invention is a bias voltage adjustment to one of the core transistors in a transistor pair of a double balanced mixer, such as a Gilbert cell mixer, to compensate for area mismatch between the mixer core transistors. The ratio of the area mismatch between any bipolar junction transistors (BJTs) is directly related to the base-emitter voltage of the mixer core transistors. Thus, an area mismatch is compensated for by adjusting the transistor bias voltage of one of the transistors in the mixer core. It can be shown that the matching between all four transistors in a double balanced mixer core is typically not required, but rather the matching between the two pairs of transistors that make up the mixer core is required in certain circumstances.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE FIGURES

The components in the figures are not necessarily to scale, emphasis instead being placed upon illustrating the principles of the invention. In the figures, like reference numerals designate corresponding parts throughout the different views.

DETAILED DESCRIPTION OF THE PREFERRED EMBODIMENTS

Figure 1:
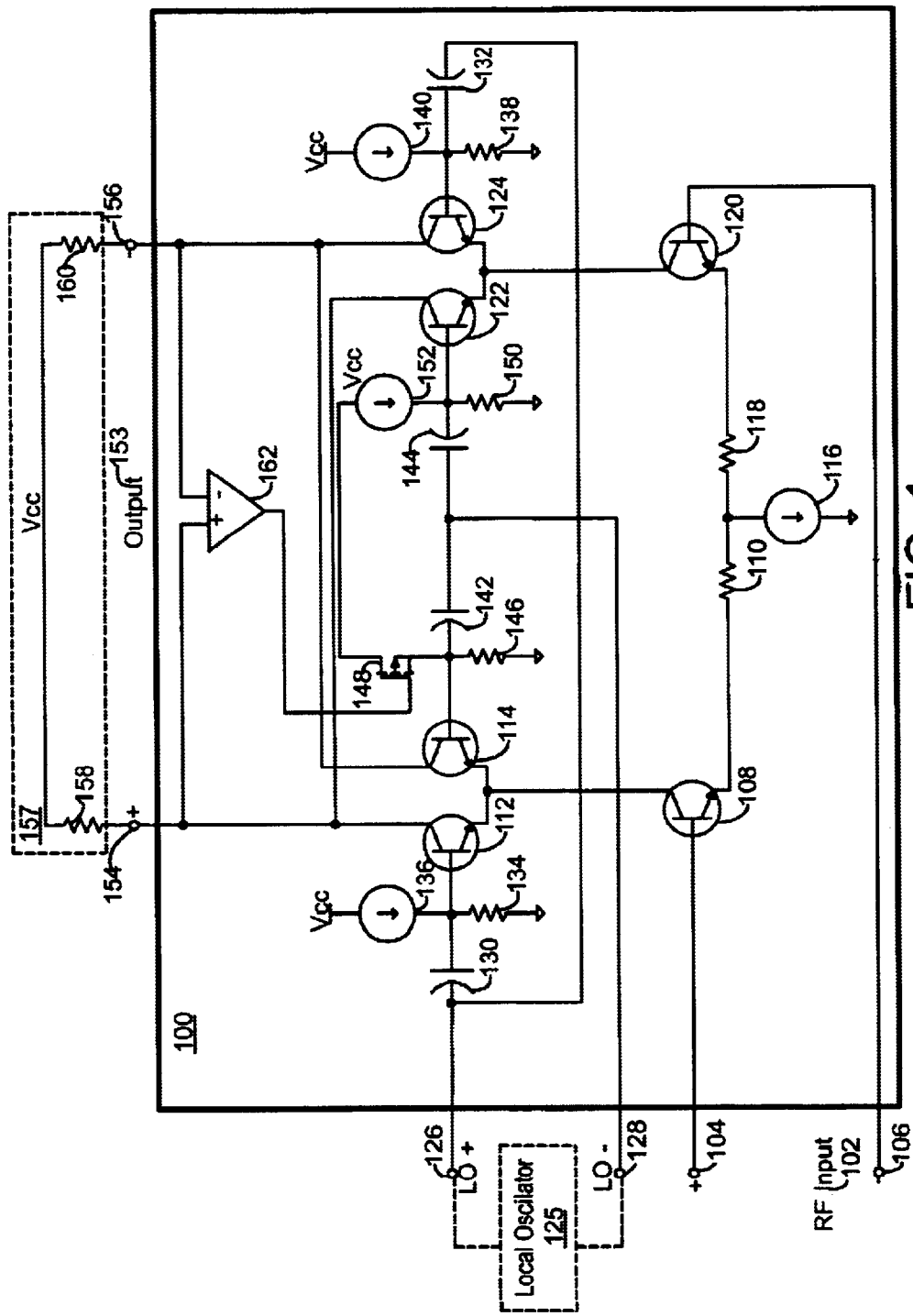
FIG. 1 is an illustration of an even-order non-linearity correction voltage feedback loop in a Gilbert cell mixer.

In FIG. 1, an illustration of an even-order non-linearity correction voltage feedback loop in a Gilbert cell mixer 100 is shown. The Gilbert cell mixer 100 has a RF input 102 with a positive RF input terminal 104 and a negative RF input terminal 106. The positive RF input terminal 104 is connected to a base of BJT 108. The emitter of BJT 108 is connected to a resistor 110, and the collector of BJT 108 is connected to the collectors of BJT 112 and BJT 114. Resistor 110 is connected to a current source 116 and another resistor 118. The other resistor 118 is connected to the emitter of BJT 120. The base of BJT 120 is connected to the negative RF input terminal 106, and the collector of BJT 120 is connected to the emitters of BJT 122 and BJT 124.

A second signal is provided by a local oscillator (LO) 125 and is connected to a LO positive terminal connection 126 and a LO negative terminal connection 128. The LO positive terminal connection 126 is connected to a capacitor 130 and another capacitor 132. The capacitor 130 is connected to a resistor 134, a current source 136 and the base of BJT 112. The other capacitor 132 is connected to another resistor 138, another current source 140 and the base of BJT 124. The LO negative terminal connection 128 is connected to two capacitors 142 and 144. Capacitor 142 is connected to a resistor 146, a drain of a field effect transistor (FET) 148 and the base of BJT 114. Capacitor 144 is connected to another resistor 150, a current source 152 and the base of BJT 122.

The output 153 is on a positive output terminal 154 and a negative output terminal 156. The output 153 is shown connected to load 157. The positive output terminal 154 is connected to a load resistor 158. The positive output terminal 154 is connected to the negative terminal of the operational amplifier 162, the collector of BJT 114 and the collector of BJT 124. The negative output terminal 156 is connected to another load resistor 160. The negative output terminal 156 is connected to the positive terminal of an operational amplifier 162, the collector of BJT 122 and the collector of BJT 112. The output of the operational amplifier 162 is connected to the gate of FET 148 and the source of FET 148 is connected to the voltage input of the current source 152.

The Gilbert cell mixer 100 has for core transistors 112, 114, 122, and 124 that are ideally identical. But, variation between each of the transistors is inevitable. The RF input 102 is received at transistors 108 and 120, while the other four transistors 112, 114, 122, and 124 (core transistors) receive the input from the LO 125 at the LO positive terminal connection 126 and LO negative terminal connection 128. If the RF input 102 were zero amplitude, then half of the current for the current source 116 would flow into the emitter of BJT 108 and half into the emitter of BJT 120. Thus the input voltage of the RF input 102 (positive RF terminal 104 and negative RF terminal 106) unbalances current so that it flip-flops back and forth between BJTs 108 and 120. Further, the collector currents at BJT 108 and 120 have equal amplitude, but opposite phase.

Mixing of the RF signal received at the RF input 102 and the signal from the LO 125 occurs at the core transistors 112, 114, 122, and 124. The signal from the LO 125 at the positive LO terminal connection 126 drives the base of BJTs 112 and 124, while the negative LO terminal connection 128 drives the base of BJT 114 and 122. Thinking of BJTs 112, 114, 122, and 124 in switching terminology, BJTs 112 and 124 are closed when BJTs 114 and 122 are open. Then when BJTs 112 and 124 are open, BJTs 114 and 122 are closed. The switching flip-flops back and forth at a rate determined by the signal received from the LO 125.

The BJTs 112, 114, 122, and 124 are not ideal and area mismatches exist between them, and thus the timing of the BJTs 112, 114, 122, and 124 is shifted. But, if the area ratio of BJTs 112 and 114 is equal to the ratio between BJTs 122 and 124, then the timing is correct and the even-order distortions are suppressed. The area mismatch between BJTs 108 and 120 is not an issue in the direct conversion embodiment. Rather than adjusting for the area mismatch in BJT pairs 112, 114 and 122, 124 individually, the ratio of the area mismatch between the BJT pairs is compensated for by a change in bias voltage at one of the transistors.

The collector current of a BJT is approximated by the equation of:

$$I_c = AJe^{V_{be}/V_t}$$

Where:
 $I_c$=Collector current
 A=Transistor Area
 J=Current Density (Amps/Area)
 $V_{be}$=Voltage across base and emitter
 $V_t$=Threshold voltage It can be shown that if the collector currents of two unequal BJTs are equal, then area mismatch corresponds to an equivalent mismatch in bias voltage:

$$\Delta V_{be} = V_t \ln[\Delta(A)]$$

Where:
 $V_{be}$=Collector current
 A=Transistor Area
 $V_{be}$=Voltage across base and emitter
 $V_t$=Threshold voltage Thus, the BJTs area mismatch (of the core BJT transistors 112, 114, 122, and 124) may be modeled as an additional voltage source at the input of one of the BJTs 112, 114, 122, and 124.

The equivalence between area and bias voltage mismatches is seen in FIG. 1 as a correction or feedback loop created by operational amplifier 162. The feedback or correction loop is a track and hold loop, as opposed to a continuous time feedback loop. The feedback or correction loop first "tracks" or corrects out the error and then it stores that data as a digital value or as analog data as shown in FIG. 1. The operational amplifier detects the difference in output voltage of the Gilbert cell mixer 100 and adjusts the bias voltage of the BJT 114 upon initialization accordingly. The output of the operational amplifier 162 activates FET 148 and adjusts the voltage received at the base of BJT 114, thus adjusting the bias voltage of one of the core BJT transistor to compensate for area mismatches and substantially reduces the DC offsets. The correction loop enables the core transistors' size to be reduced while requiring less drive current. Thus, the desirable effect of reducing bias currents while maintaining or increasing mixer performance is achieved. The reduction in drive current also aids in extending battery life of mobile devices.

Several simulations of signal independent DC offsets were conducted. The transient DC offset was introduced at an input of one of the transistors in the mixer core at 0 seconds and the correction loop activated at 500 nanoseconds. The results of the simulation are shown in TABLE 1.

TABLE 1

| Input DC Offset | Equiv. Area Mismatch | Resulting Output DC Offset | Offset After Correction |
|---|---|---|---|
| 0.22 mV | 0.85% | −50.25 dBV | −92.4 dBV |
| 0.57 mV | 2.2% | −40.91 dBV | −84.01 dBV |
| 0.92 mV | 3.56% | −37.8 dBV | −79.83 dBV |
| 1.26 mV | 4.97% | −34.9 dBV | −76.89 dBV |
| 1.6 mV | 6.35% | −32.8 dBV | −72.65 dBV |
| 1.95 mV | 7.79% | −31.1 dBV | −72.65 dBV |
| 2.3 mV | 9.25% | −29.7 dBV | −70.78 dBV |
| 2.65 mV | 10.23% | −28.4 dBV | −68.22 dBV |

As shown in TABLE 1, the area mismatch or input DC offsets increase the advantage of the feedback loop in the mixer.

Simulations were also conducted on a mixer circuit having a feedback loop with signal dependent DC offsets with the results shown in TABLE 2. The first results are from the simulation of three circuits: one with no feedback loop and no transistor mismatch; a second with no loop and transistor mismatch; and a third with transistor mismatch and a correction loop in place. A 0.66 mV DC offset was introduced at the input of one transistor in the mixer core. The transient simulation was conducted for 1 microsecond, high accuracy settings, and taking a 4096 sample discrete Fourier transform. The second results are from the same three circuits, but with a 1.33 mV offset introduced at an input of one of the transistors in the mixer core.

TABLE 2

| | | Resulting Output DC Current | | |
|---|---|---|---|---|
| Input DC Offset | Equiv. Area Mismatch | No Mismatch No Loop | Mismatch and No Loop | Mismatch and Loop |
| 0.66 mV | 2.6% | −69 dBmA | 8.17 dBmA | −22.6 dBmA |
| 1.33 mV | 5.2% | −68 dBmA | 14.2 dBmA | −17.7 dBmA |

As shown in TABLE 2, the area mismatch corrects for the area mismatch with signals having dependent DC offsets. It is noted the corrections are not as great for the dependent DC offsets as for the independent offsets, but the advantage of having a feedback loop is shown in both TABLE 1 and TABLE 2.

Figure 2:
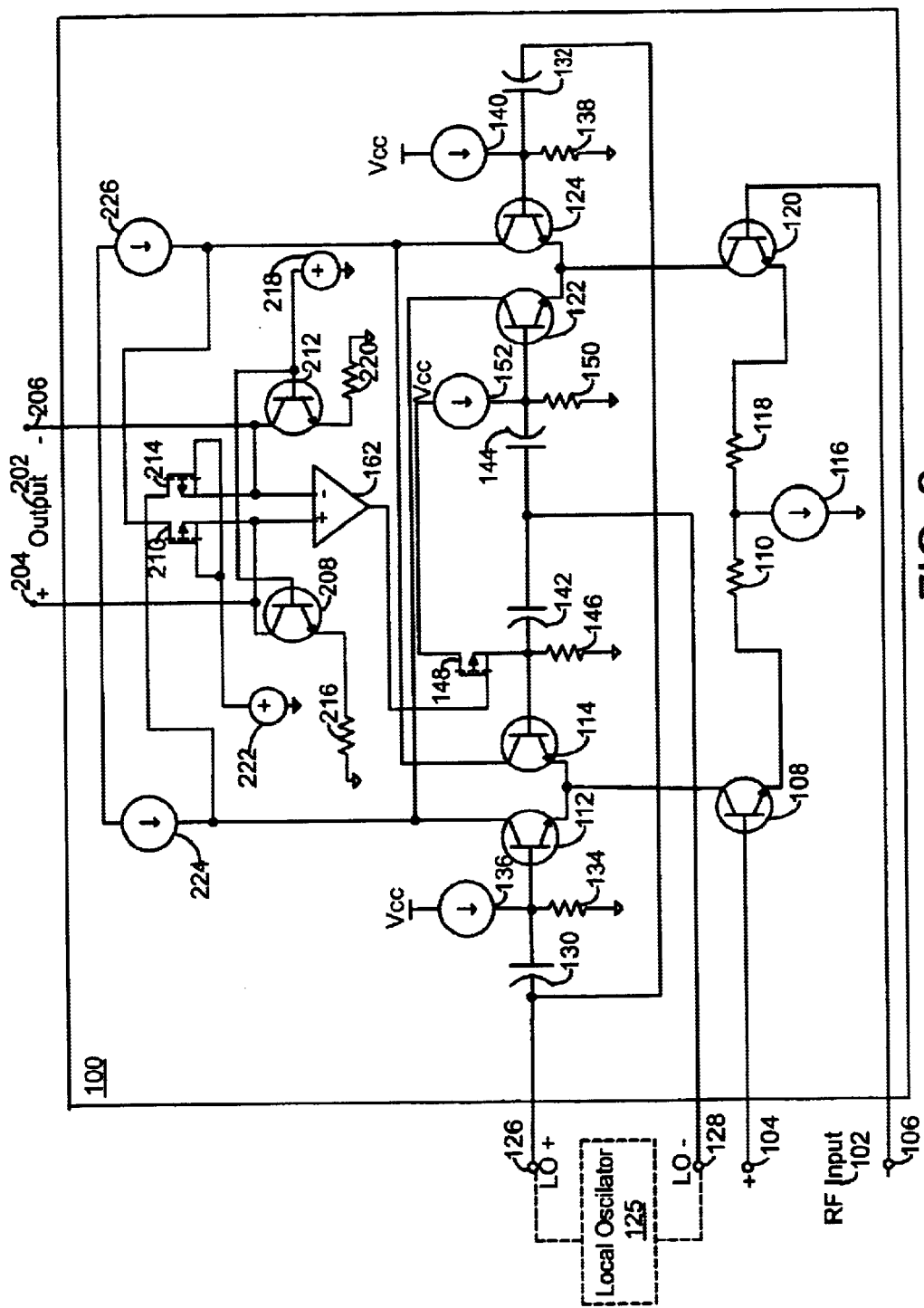
FIG. 2 is an illustration of an even-order non-linearity correction current feedback loop in the Gilbert cell mixer of FIG. 1.

In FIG. 2, an illustration of an even-order non-linearity correction current feedback loop in a Gilbert cell mixer 100 is shown. The Gilbert cell mixer 100 has an RF input 102 with a positive RF input terminal 104 and a negative RF input terminal 106. The positive RF input terminal 104 is connected to a base of BJT 108. The emitter of BJT 108 is connected to a resistor 110, and the collector of BJT 108 is connected to the collectors of BJT 112 and BJT 114. Resistor 110 is connected to a current source 116 and another resistor 118. The other resistor 118 is connected to the emitter of BJT 120. The base of BJT 120 is connected to the negative RF input terminal 106, and the collector of BJT 120 is connected to the emitters of BJT 122 and BJT 124.

A second signal provided by LO 125 is connected to a LO positive terminal connection 126 and LO negative terminal connection 128. The LO positive terminal connection 126 is connected to a capacitor 130 and another capacitor 132. The capacitor 130 is connected to a resistor 134, a current source 136 and the base of BJT 112. The other capacitor 132 is connected to another resistor 138, another current source 140 and the base of BJT 124. The LO negative terminal connection 128 is connected to two capacitors 142 and 144. Capacitor 142 is connected to a resistor 146, a drain of a FET 148 and the base of BJT 114. Capacitor 144 is connected to another resistor 150, a current source 152 and the base of BJT 122.

The output 202 is on a positive output terminal 204 and a negative output terminal 206. The positive output terminal 204 is connected to the collector of BJT 208, the drain of FET 210 and the positive input of operational amp 162. The negative output terminal 206 is connected to the collector of BJT 212, the negative input of operational amp 162 and the source of FET 214. The emitter of BJT 208 is connected to a resistor 216. The resistor 216 is also connected to the ground. The base of BJT 208 is connected to the base of BJT 212 and a voltage source 218. The emitter of BJT 212 is connected to resistor 220 that is also connected to the ground. The gates of FETs 210 and 214 are connected to another voltage source 222. The output of current source 224 is connected to the source of FET 214, the collector of BJT 122 and the collector of BJT 112. Additionally, current source 226 is connected to the source of FET 210, the collector of BJT 114 and the collector of BJT 124. The output of operational amp 162 is connected to the gate of FET 148. The exact resistor values and voltage source values will vary by implementation and desired mixer characteristics, but a person skilled with such mixers will be able to select the resistor and voltage source values appropriately.

A RF input 102 is mixed with another input (from the LO 125). The core transistor pairs 112 & 114 and 122 & 124 mix the two inputs resulting in an output 202. The equivalence between area and bias voltage mismatches is seen in FIG. 2 as a correction or feedback loop created by operational amplifier 162. The feedback or correction loop is a track and hold loop, as opposed to a continuous time feedback loop. The compensation for the area mismatch between the mixer core transistors is similar to FIG. 1, but part of the amplification and/or filtering takes place prior to the adjustment. This demonstrates that the determination of a delta voltage or current value that adjusts for area mismatch between the mixer core transistors may occur at different places within the circuit. The two voltages are compared by operational amp 162 and a delta voltage value representing the ratio of the area mismatch between the core transistor pairs 112 & 114 and 122 & 124. The delta voltage value is then used at the gate of FET 148 to compensate for area mismatch. Using voltage to compensate for the ratio of area mismatch is successful because of the relationship between the ratio of transistor area between the core transistors as shown in the formulas discussed previously.

The current sources 224 and 226 are shown as being located within the Gilbert cell mixer 100, but in alternate embodiments the current sources 224 and 226 may be located external to the Gilbert cell mixer. Additionally, the FET transistors 210 and 214 may be located external to the Gilbert cell mixer in alternate embodiments. The Gilbert cell mixer 100 is shown as a single device, but it may be implemented as a single semiconductor chip, multiple chips connected using flip chip technology, as discrete components, or any combination of the aforementioned fabrication approaches.

Figure 3:
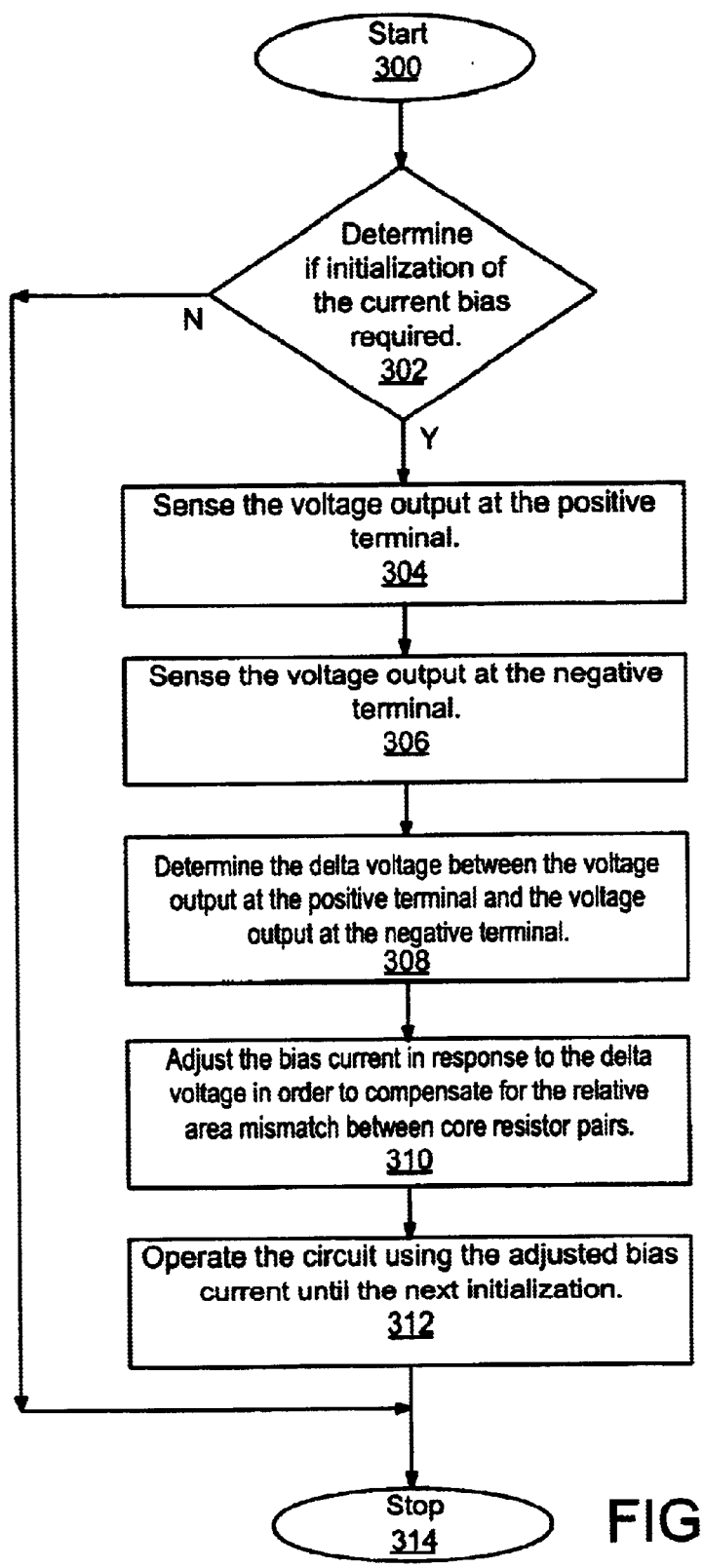
FIG. 3 is a flow diagram illustrating an exemplar process of an even-order non-linearity correction feedback loop in a Gilbert cell mixer.

In FIG. 3, a flow diagram illustrating an exemplar process of even-order non-linearity correction feedback in a Gilbert cell mixer 100 is shown. The process starts (300) when the power or voltage is applied to the Gilbert cell mixer 100. Upon power or voltage being applied to the Gilbert cell mixer 100, a determination is made to initialize the current bias to compensate for the ratio of the area mismatch of the core transistors (302). The initialization occurs upon power or voltage being applied to the Gilbert cell mixer 100. In alternate embodiments, the initialization may occur at predefined intervals or upon predetermined events such as timers or loss of DC information in the output signal. If initialization is required (302) because the circuit has been powered on, then a voltage is present at the positive output terminal 154 and at the negative output terminal 156. The voltage at the positive output terminal (first bias voltage) is sensed (304) or measured. The voltage at the negative output terminal (second bias voltage) is sensed (306) or measured. The sensing (304, 306) is shown in FIG. 3 as occurring in a predetermined order, but in actual practice the sensing preferably occurs simultaneously. Sensing is accomplished by utilization of an operational amplifier 162 and results in a delta bias voltage (308). Measuring is a less desirable approach because of the additional circuitry that is required to measure and then compare two voltages.

The DC offset of the output signal is corrected (310) by adjusting the bias voltage on a transistor, BJT 114, in the first pair of transistors by the delta bias voltage. The delta bias voltage can be stored in analog form as a voltage across a capacitor, or digitally. The circuit then operates using the delta bias voltage (312) to compensate for the ratio of area mismatches of the core transistors of the Gilbert cell mixer 100. Once power is removed from the Gilbert cell mixer 100, processing stops (314). In an alternate embodiment, monitoring the output current, rather than the output voltage, accomplishes the process for adjustment of the DC offset.

While various embodiments of the invention have been described, it will be apparent to those of ordinary skill in the art that many more embodiments and implementations are possible that are within the scope of this invention.

What is claimed is:

1. An apparatus for signal mixing, comprising:
  a first set of transistors having a first transistor pair area ratio and a first bias voltage electrically connected to a first output branch;
  a second set of transistors having a second transistor pair area ratio and a second bias voltage electrically connected to a second output branch; and
  a correction loop operable connected to the first set of transistors, where the correction loop determines a delta bias voltage from a current in the first output branch and another current in the second output branch, and adjusts the first bias voltage on a transistor in the first transistor pair such that the current in the first output branch is equal to the other current in the second output branch.

2. The apparatus of claim 1, wherein the first set of transistors has an associated first area mismatch and the second set of transistors has an associated second area mismatch, and the first bias voltage is combined with the delta bias voltage such that the effect on the current along with the first area mismatch of the first set of transistors is equal to the effect on the other current from the second area mismatch of the second set of transistors.

3. The apparatus of claim 1, wherein the first set of transistors has an associated first area mismatch and the second set of transistors has an associated second area mismatch, and the second bias voltage is combined with the delta bias voltage such that the effect on the other current along with the second area mismatch of the second set of transistors is equal to the effect on the current from the first area mismatch of the first set of transistors.

4. The apparatus of claim 1, wherein the correction loop is an operational amplifier.

5. The apparatus of claim 4, further comprising a transistor that adjusts the first bias voltage by the delta bias voltage.

6. The apparatus of claim 5, wherein the transistor is a FET.

7. The apparatus of claim 1, further comprising a positive RF input terminal and a negative RF input terminal that receive a RF input, and a positive input terminal and a negative input terminal that receive another signal input.

8. The apparatus of claim 7, wherein the other positive input terminal and the other negative input terminal receive a local oscillator signal.

9. A method for mixing signals, comprising:
  sensing a current in a first output branch that is electrically connected to a first pair of transistors;
  sensing another current in a second output branch that is electrically connected to a second pair of transistors; and
  adjusting the bias current on a transistor in the first pair of transistors in response to the first current and the second current.

10. The method of claim 9, further comprising determining a delta bias voltage from the current and the other current that represents a ratio of a first area of the first pair of transistors to a second area of the second pair of transistors.

11. The method of claim 10, wherein sensing the current includes measuring the current.

12. The method of claim 10, wherein sensing the other current includes measuring the other current.

13. The method of claim 10, further includes initializing the bias current upon an occurrence of a predetermined event.

14. The method of claim 13, wherein the predetermined event is initialization of a circuit containing the first transistor pair and the second transistor pair.

15. The method of claim 13, wherein the predetermined event is an indication of loss of data.

16. An apparatus for signal mixing, comprising:
  a first set of transistors having a first transistor area ratio and a first bias voltage;
  a second set of transistors having a second transistor area ratio and a second bias voltage;
  a correction loop operable connected to the first set of transistors, the correction loop determines a delta bias voltage from the first bias voltage and the second bias voltage and adjusts the first bias voltage on a transistor in the first transistor pair by the delta bias voltage that is related to a variation of the first transistor area ratio and the second transistor area ratio by the formula, $\Delta V_{be}=V_t \ln[\Delta(A)]$, where $\Delta V_{be}$ is the difference in the first bias voltage and the second bias voltage, $V_t$ is an equal collector current applied to the first transistor pair and the second transistor pair, and $\Delta(A)$ is the difference in the first transistor area ratio and the second transistor area ratio; and
  a transistor that adjusts the first bias voltage in relation to the delta bias voltage.

17. An apparatus for signal mixing, comprising:
  a first set of transistors having a first transistor area ratio and a first bias voltage;
  a second set of transistors having a second transistor area ratio and a second bias voltage;
  a means for determining a delta bias voltage from the first bias voltage and the second bias voltage operable connected to the first set of transistors; and
  a means for adjusting the first bias voltage at a transistor in the first transistor pair by the delta bias voltage.

18. The apparatus of claim 17, wherein the delta bias voltage is related to a variation of the first transistor area ratio and the second transistor area ratio by the formula, $\Delta V_{be}=V_t \ln[\Delta(A)]$, where $\Delta V_{be}$ is the difference in the first bias voltage and the second bias voltage, $V_t$ is an equal collector current applied to the first transistor pair and the second transistor pair, and $\Delta(A)$ is the difference in the first transistor area ratio and the second transistor area ratio.

19. The apparatus of claim 17, wherein the means for determining is an operational amplifier.

20. The apparatus of claim 19, further comprising a transistor that adjusts the first bias voltage by the delta bias voltage.

21. The apparatus of claim 20, wherein the transistor is a FET.

22. The apparatus of claim 17, further comprising a positive RF input terminal and a negative RF input terminal that receive a RF input, and a positive input terminal and a negative input terminal that receive another signal input.

23. The apparatus of claim 22, wherein the other positive input terminal and the other negative input terminal receive a local oscillator signal.

* * * * *